United States Patent [19]
Gailus et al.

[11] Patent Number: 5,559,468
[45] Date of Patent: Sep. 24, 1996

[54] FEEDBACK LOOP CLOSURE IN A LINEAR TRANSMITTER

[75] Inventors: Paul H. Gailus, Prospect Heights; Ronald H. Chapman, Carol Stream; Jeffrey B. Wilhite, Rolling Meadows, all of Ill.

[73] Assignee: Motorola, Inc., Schaumburg, Ill.

[21] Appl. No.: 84,661

[22] Filed: Jun. 28, 1993

[51] Int. Cl.[6] .................................................. H03F 1/34
[52] U.S. Cl. ................................... 330/110; 330/149
[58] Field of Search ............................. 330/85, 96, 99, 330/110, 129, 149; 455/126

[56] References Cited

U.S. PATENT DOCUMENTS

| | | | |
|---|---|---|---|
| 3,516,002 | 6/1970 | Hillis | 330/85 |
| 3,729,687 | 4/1973 | Orlandini | 330/85 |
| 3,737,798 | 6/1973 | Faraguet | 330/85 |
| 5,041,793 | 9/1991 | Gailus | 330/2 |
| 5,066,923 | 11/1991 | Gailus et al. | 330/107 |
| 5,132,634 | 7/1992 | Suarez | 330/129 |
| 5,134,718 | 7/1992 | Gailus | 455/102 |
| 5,278,997 | 1/1994 | Martin | 330/127 |

*Primary Examiner*—Steven Mottola
*Assistant Examiner*—Tiep H. Nguyen
*Attorney, Agent, or Firm*—Susan L. Lukasik

[57] ABSTRACT

A linear amplifier (103) has a negative feedback loop that has a closed loop gain and a forward path gain. The negative feedback loop is closed, such that quick changes in the closed loop gain are prevented, thereby reducing splatter. When the negative feedback loop is opened, quick changes in the closed loop gain are also prevented, thereby reducing splatter.

26 Claims, 2 Drawing Sheets

FEEDBACK LOOP CLOSURE IN A LINEAR TRANSMITTER

FIELD OF THE INVENTION

This invention relates to radio frequency (RF) transmitters, including but not limited to feedback in linear RF transmitters.

BACKGROUND OF THE INVENTION

Linear RF transmitters are known. A Cartesian feedback transmitter constitutes one such known transmitter. When properly adjusted, such a negative feedback based transmitter architecture will operate in a satisfactory linear mode.

The loop in the amplifier in a Cartesian feedback transmitter must be open at times, such as when the transmitter is powered up or when phase training is performed. Upon restoring the closed loop operation, however, the loop gain must be ramped up slowly in order to prevent splatter, where splatter typically results from RF energy radiated at frequencies other than those assigned to the transmitter. In addition, the gain must be increased to the full amount in a limited amount of time. Conversely, when the loop is opened, the loop gain must be ramped down slowly to prevent splatter. In this case, the gain must be reduced to a substantially zero value in a limited amount of time.

Accordingly, there is a need for an apparatus for a linear amplifier that ramps up or down the loop gain slowly to prevent splatter, but which completes the gain ramping process within a limited amount of time.

DESCRIPTION OF A PREFERRED EMBODIMENT

The following describes an apparatus for and method of preventing splatter in a linear amplifier by ramping up the loop gain slowly when splatter is more likely to occur and then quickly ramping up the loop gain to reach the full gain amount within the time allotted for closing the transmitter amplifier loop. When opening the transmitter amplifier loop, the loop gain is ramped down quickly until splatter is more likely to occur, and then slowly ramped down to the final open loop value of $\cong 0$.

Figure 1:
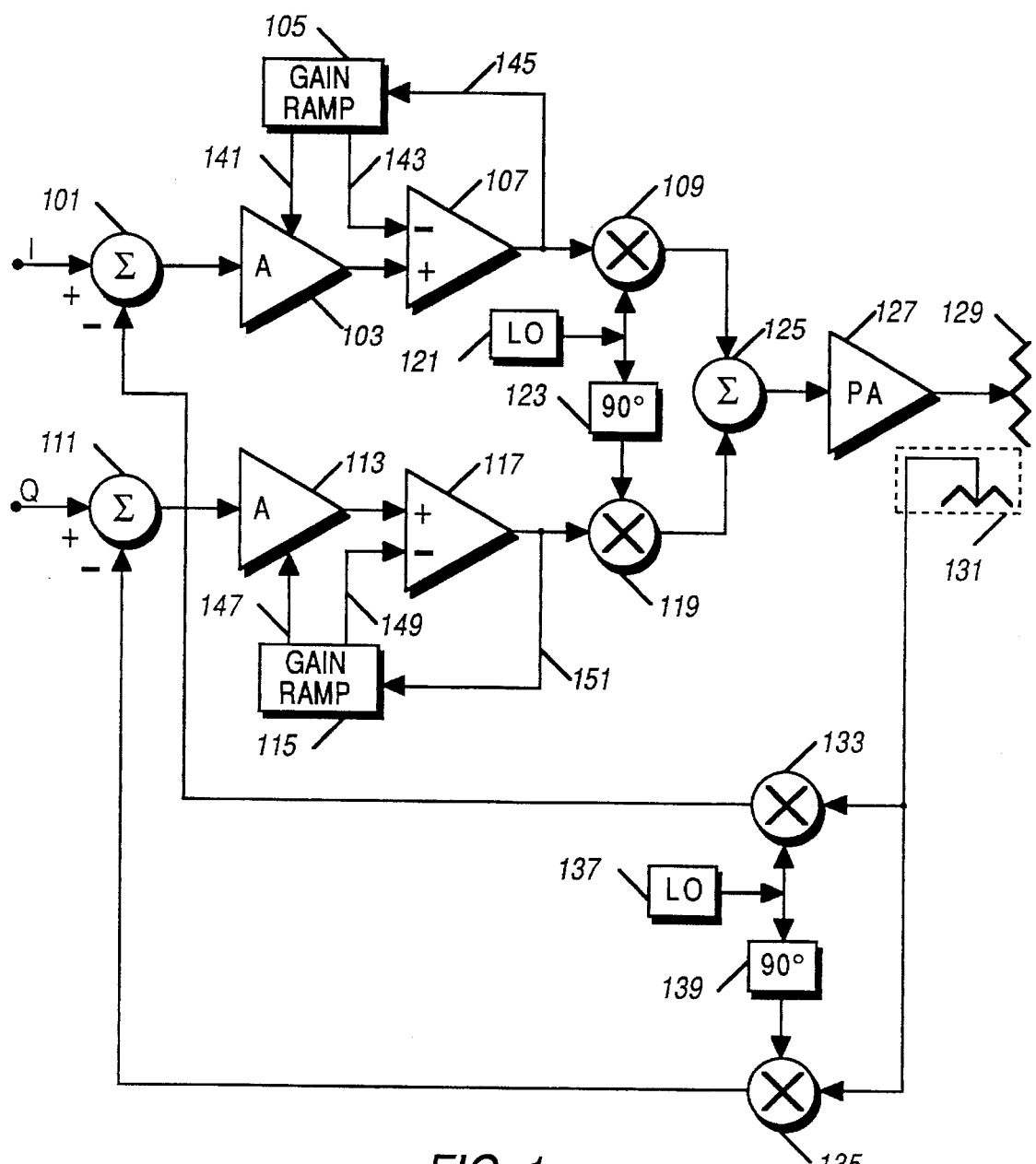
FIG. 1 is a block diagram of a linear transmitter with a gain ramp in accordance with the invention.

The present invention includes a gain ramp for a linear feedback transmitter that prevents the transmitter from broadcasting unauthorized energy into channels other than the channel to which the transmitter is assigned. The off-channel splatter that is prevented would otherwise occur when the transmitter feedback loop is being closed or opened. The loop is closed at the beginning of a transmit time slot and opened at the end of a transmit time slot in a time division multiplexed system. The basic closed loop transfer function of a feedback transmitter amplifier, such as shown in FIG. 1, is $v_o/v_i = A/(1+A\beta)$, where A is the forward path gain, $\beta$ is the feedback path gain, and $A\beta$ is the loop gain. To close the loop, we take A from a very low value ($\cong 0$) to a high final value, $A_{max}$. Thus, A is a function of time, as represented by A(t), but A will be used for simplicity throughout the preferred embodiment. As A is increased, $v_o/v_i$ increases as A increases until $|A\beta|$ (the magnitude of $A\beta$) is approximately one. When $|A\beta|<1$, $v_o/v_i$ changes very rapidly and splatter can occur. The gain ramp is designed to force changes in $v_o/v_i$ when $|A\beta|<1$ to occur more slowly, thus reducing splatter. After passing the region where $|A\beta|<1$, the gain ramp speeds up in order to reach full gain in the limited amount of time as is acceptable for the system in which the transmitter is employed. When the loop is opened, the gain ramp quickly decreases until a point before $|A\beta|\cong 1$, at which time the gain ramp slows down until the gain reaches a very low value ($\cong 0$) within the limited amount of time acceptable for the system.

Referring to FIG. 1, a Cartesian feedback transmitter, in accordance with the invention, can be seen. In a first signal path, in-phase baseband information, I, is input to a summer 101. The output of the summer 101 is input to an amplifier 103 with gain A. The output of the amplifier 103 is input to the positive input of an amplifier 107. The output 145 of the amplifier 107 is input to a mixer 109 and a gain ramp 105. A first output 143 of the gain ramp 105 is input to a negative input terminal of the amplifier 107. A second output 141 of the gain ramp 105 is input to the control input of the amplifier 103.

In a second signal path, similar to the in-phase baseband information signal path, quadrature baseband information, Q, is input to a summer 111. The output of the summer 111 is input to an amplifier 113 with gain A. The output of the amplifier 113 is input to the positive terminal of an amplifier 117. The output 151 of the amplifier 117 is input to a mixer 119 and a gain ramp 115. A first output 149 of the gain ramp 115 is input to the negative terminal of amplifier 117. A second output 147 of the gain ramp 115 is input to the control input of the amplifier 113. The two gain ramps 105 and 115 are essentially identical.

A local oscillator 121 emits a signal at the carrier frequency of the transmitter, which signal is input to the mixer 109 and a 90 degree phase shifter 123. The output of the phase shifter 123 is input to the mixer 119. The outputs of the mixers 109 and 119 are input to a summer 125. The output of the summer 125 is input to a power amplifier (PA) 127, the output of which is coupled to an appropriate output element 129.

A coupler 131 responsive to the output of the PA 127 provides a feedback signal to both the in-phase and quadrature feedback paths. The up-converted signal is obtained from the output of the PA 127 and is first down-converted through appropriate mixers 133 and 135 and a local oscillator 137 and a phase shifter 139. A phase-shifted version of the output of the local oscillator 121 could be used in place of local oscillator 137. In-phase and quadrature down-converter output signals from the feedback path mixers 133 and 135 are provided through provision of the appropriate 90 degree phase shift 139. Thus, the in-phase output of the mixer 133 is input to the negative input terminal of the summer 101, and the quadrature output of the mixer 135 is input to the negative input terminal of the summer 111.

The above blocks will be generally understood by those skilled in the art. In addition, further details regarding the variable gain baseband amplifier can be found in U.S. Pat. No. 5,066,923, titled "Linear Transmitter Training Method and Apparatus" and information regarding a phase shift adjustment control mechanism for the feedback loops can be found in U.S. Pat. No. 5,134,718, titled "Fast Phase Shift Adjusting Method and Device for Linear Transmitter." Both of these documents are incorporated herein by this reference.

Figure 2:
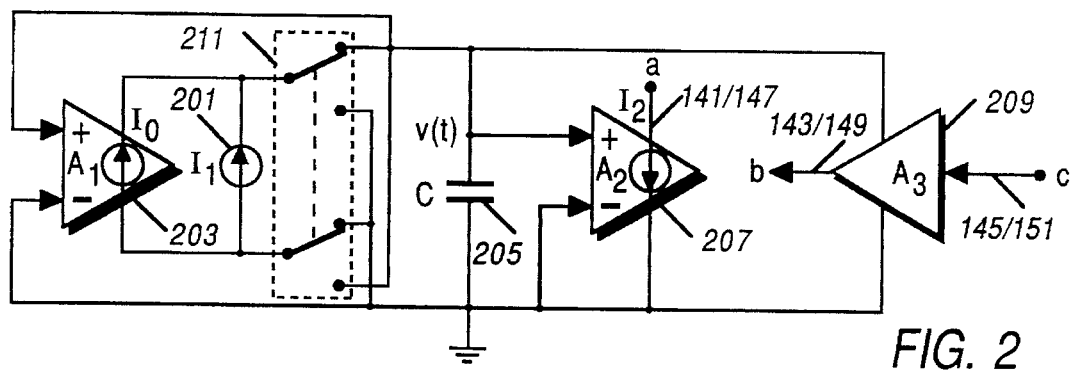
FIG. 2 is a block diagram of a gain ramp in accordance with the invention.
Figure 3:
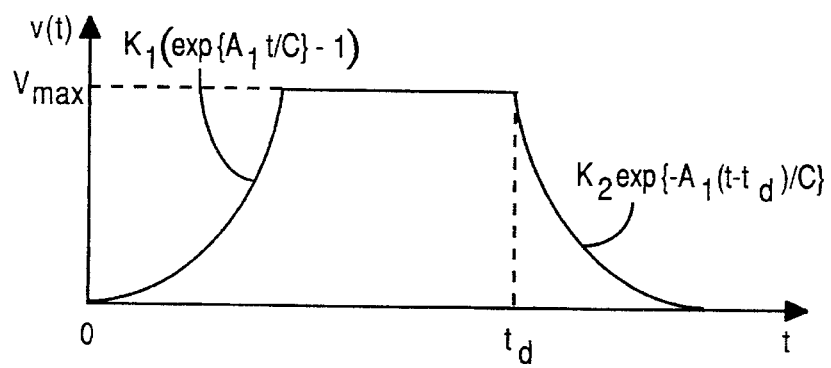
FIG. 3 is a timing diagram showing voltage change in a gain ramp in accordance with the invention.

As the transmitter amplifier loop is closed, a constant current source 201 sources current $I_1$ to the ungrounded pin of capacitor 205 in FIG. 2. A first amplifier 203 with transconductance gain $A_1$ also sources current $I_0$ to the ungrounded pin of the capacitor 205. The other output terminals of the amplifier 203 and the constant current source 201 are grounded to complete the path to the grounded pin of the capacitor 205. $I_1$ is a very low level current that begins charging the capacitor 205. As $I_1$ is a constant direct current and $I_0$ is initially 0, the capacitor voltage begins to ramp from 0 linearly with time and is directly proportional to $I_1/C$, which is very small. This is true as long as $I_0$ is much smaller than $I_1$. As the voltage v(t) increases, the input to the first amplifier 203 increases, and the current from $I_0$ increases as well. As $I_0$ approaches the level of $I_1$, the positive feedback created by the connection of v(t) to the input of amplifier 203 becomes significant. The capacitor voltage then ramps towards the supply voltage with an increasing slope, until the voltage reaches $V_{max}$, the maximum voltage. The slope is shown in FIG. 3 as is represented by the equation $K_1(\exp[A_1 t/C]-1)$, where $A_1$ is the transconductance gain of the first amplifier 203, $K_1 = I_1/A_1$, C is the capacitance of the capacitor 205, and t is time.

The capacitor voltage controls the current output from a second amplifier 207 which has gain $A_2$ and controls the gain of the associated amplifier in FIG. 1 (amplifier 103 or amplifier 113). Thus, the gain in the feedback linear transmitter circuit increases from 0 in an exponential manner. Note that the gain increase would not necessarily have to be exponential. Other functions might be used provided they increase more slowly when the magnitude of the loop gain is less than one. The capacitor 205, and hence v(t), is coupled to the positive input terminal of amplifier 207, and the negative terminal of amplifier 207 is grounded. Node a is the same as node 141 or node 147 from FIG. 1, depending on whether the gain ramp circuit is the gain ramp 105 or the gain ramp 115.

When the transmitter loop is open, there is a possibility of substantial DC offset in the forward path baseband circuits accumulating at the input to the up mixers 109 and 119. This offset causes unacceptable local oscillator feedthrough to occur. In order to avoid this problem, a secondary or local feedback loop is created as shown in FIG. 2 to provide a stable operating point. The local feedback loop closes when the main transmitter amplifier loop is open, so any DC offset can be tracked out. A third amplifier 209 with gain $A_3$ is a feedback amplifier for the local feedback loop. The third amplifier 209 turns off when the loop closes and the capacitor 205 is charging, and the third amplifier 209 is turned on when the capacitor 205 is discharging. The local feedback from the third amplifier 209 is controlled by the same voltage v(t) as the second amplifier 207. Therefore, the transition between local feedback and main loop feedback is smooth, resulting in minimal splatter.

When the gain ramp of FIG. 2 is used to downramp the voltage v(t), i.e., open the transmitter amplifier loop, the paths of $I_0$ from the first amplifier 203 and $I_1$ from the constant current source 201 to the capacitor 205 are reversed from that in which the gain ramp is used to upramp the voltage v(t). When downramping the current, the upper outputs of the first amplifier 203, and the constant current source 201 are grounded and the lower outputs of amplifier 203 and the constant current source $I_1$ 201 are connected to the ungrounded pin of the capacitor 205. The capacitor voltage decreases, according to the function $K_2\exp[-A_1(t-t_d)/C]$, as shown in the right hand side of FIG. 3, where the time that the ramp down begins is $t_d$, and $K_2 = v(t_d)$. The input of the third amplifier 209 is the same as that provided by node 145 for gain ramp 105 or node 151 for gain ramp 115. The output of the third amplifier 209 is shown as node b, and is the same as node 143 for gain ramp 105 or node 149 for gain ramp 115 as shown in FIG. 1.

As previously described, the gain of either feedback transmitter amplifier 103 or 113 of FIG. 1 may be represented as A(t). Taking into consideration the voltage, v(t), of the capacitor 205, A(t) may be written in equation form as $A(t) = GA_2K_1(\exp[A_1 t/C] -1)$ as the transmitter amplifier loop is closed. The maximum forward gain value is $A_{max} = GA_2V_{max}$, which is a constant value. G is a constant value that is chosen to achieve the desired $A_{max}$ for the feedback transmitter amplifier 103 or 113. As the transmitter amplifier loop is opened, A(t) may be written as $GA_2K_2\exp[-A_1(t-t_d)/C]$.

Phrased in a different manner, the gain ramp is achieved by the use of two current sources and a capacitor. The ramp is initiated by applying a small constant current source ($I_1$) to a capacitor, which causes the voltage on the capacitor to begin to rise very slowly. It is important that the voltage rise very slowly when the gain is low, where $|A\beta|$ is less than one, as quick changes in gain in this region cause splatter. The second current source is a voltage controlled current source ($I_0$) that is referenced to the voltage on the capacitor 205 in FIG. 2. The current from this second current source is applied back to the capacitor, creating a positive feedback loop. Thus, as the voltage on the capacitor 205 rises due to the constant current source, the input to the voltage controlled current source rises, causing the output current to rise. The output current is applied back to the capacitor causing the capacitor voltage to rise more. The positive feedback causes the capacitor voltage to rise with an exponential characteristic versus time until it reaches its maximum value. The forward path gain, A, is proportional to the capacitor voltage, so that the gain ramp also has an exponential characteristic. The exponential is ideal in this application, as it is desired to have very slow change during the crucial part of the ramp where the gain is very low, and then an increasing faster gain change towards the end of the ramp so that maximum gain is reached in an acceptable amount of time.

When the main loop is opened, the process is reversed using negative feedback, so that the gain decreases quickly at first and then decreases more slowly as the forward path gain, A, passes back through the crucial point where $|A\beta|$ is less than one. The capacitor voltage and hence gain A thus exhibit a negative exponential characteristic versus time for the closed to open loop transition.

Other methods exist for producing an exponential function versus time. For example, at the gain ramp output 141/147, a linear ramp voltage input to a device with an exponential transfer function, e.g. a bipolar transistor, is encompassed by the spirit of the invention.

Figure 4:
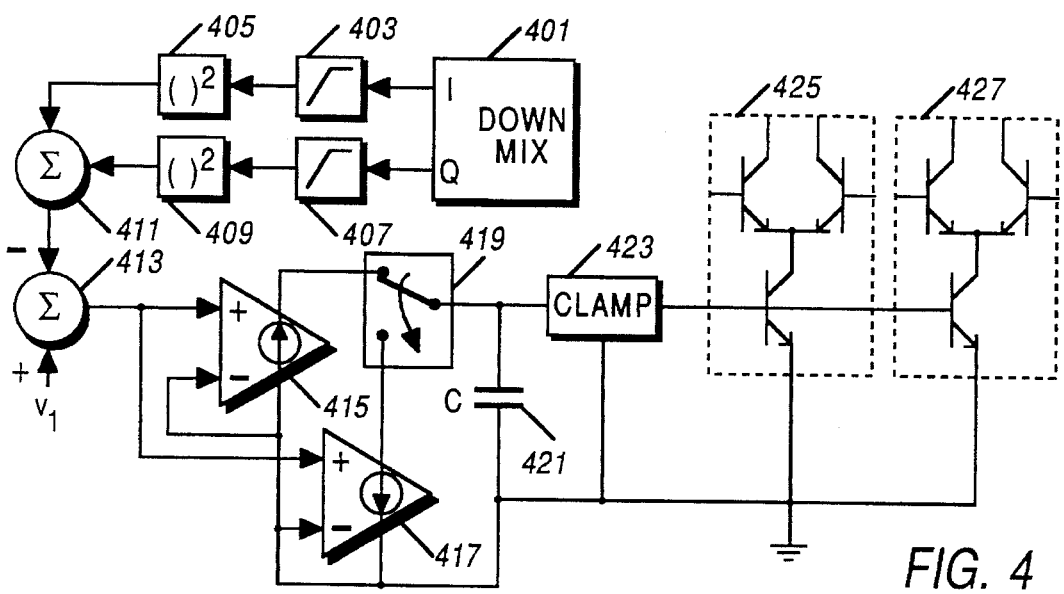
FIG. 4 is a block diagram of an alternative gain ramp in accordance with the invention.

An alternative approach to controlling gain transition is shown in FIG. 4. The approach high pass filters 403 and 407 the downmixed 401 baseband signal to obtain only the high frequency off-channel of baseband signals I and Q. The absolute value of the signal is obtained, as cancellation of quick changes in both positive and negative signals is desired. In the diagram shown, the signals are squared 405 and 409. The squaring both rectifies the signal and increases the amplitude for better detection of splatter. The squared signals are then added 411 and the net is subtracted from $v_1$, which sets the nominal rate of charge/discharge. The difference of these two signals forms the input to amplifiers 415 and 417 that charge/discharge a capacitor 421. The capacitor voltage is damped by voltage clamp 423 so that a maximum fully charged value is established. The resulting voltage is then used to control the I 425 and Q 427 channel amplifier tail currents, which control the loop gain of the feedback linear transmitter. Amplifier stages 425 and 427 constitute a portion of the amplifiers 103 and 113, respectively, in FIG. 1. Therefore, off-channel signal spikes that would otherwise cause splatter are tracked out by the feedback loop. This tracking feature has the advantage that charging or discharging is slowed only in regions where splatter can occur resulting in the fastest possible response time for a given level of splatter. Hence, the circuit of FIG. 4 prevents quick changes in the closed-loop gain while closing the loop by detecting splatter and allowing the forward path gain to increase at as fast a rate posssible while maintaining a reduced level of detected splatter, and also prevents quick changes in the closed-loop gain while opening the loop by detecting splatter and allowing the forward path gain to decrease at as fast a rate posssible while maintaining a reduced level of detected splatter. More circuitry, however, is necessary for implementation of this method than for the method discussed in FIG. 1 and FIG. 2.

What is claimed is:

1. An apparatus comprising:
    a linear amplifier having a negative feedback loop that has a closed loop gain and a forward path gain; and
    means for closing the negative feedback loop, wherein the means for closing prevents quick changes in the closed loop gain, thereby reducing splatter, wherein the means for closing comprises a secondary feedback loop.

2. The apparatus of claim 1, wherein the secondary feedback loop is opening while the negative feedback loop is closing, and the secondary feedback loop is open while the negative feedback loop is closed.

3. The apparatus of claim 1, wherein the linear amplifier further comprises subsequent stages, and wherein the secondary feedback loop stabilizes operation of the subsequent stages in the linear amplifier when the linear amplifier is operating in an open loop condition.

4. The apparatus of claim 1, wherein the secondary feedback loop has a secondary path gain, and wherein as the forward path gain increases, the secondary path gain decreases.

5. An apparatus comprising:
    a linear amplifier having a negative feedback loop that has a closed loop gain and a forward path gain; and
    means for closing the negative feedback loop, wherein the means for closing prevents quick changes in the closed loop gain, thereby reducing splatter, wherein the means for closing prevents quick changes in the closed loop gain by adjusting the forward path gain according to $$GA_2K_1(\exp[A_1t/C]-1),$$

where
    G is a constant;
    $A_2$ is a first transconductance gain;
    $K_1$ is current/$A_1$;
    $A_1$ is a second transconductance gain;
    t represents time;
    C is capacitance.

6. An apparatus comprising:
    a linear amplifier having a negative feedback loop that has a closed loop gain and a forward path gain; and
    means for closing the negative feedback loop, wherein the means for closing prevents quick changes in the closed loop gain, thereby reducing splatter, wherein the means for closing prevents quick changes in the closed-loop gain by detecting splatter and allowing the forward path gain to increase at as fast a rate possible while maintaining a reduced level of detected splatter.

7. An apparatus comprising:
    a linear amplifier having a negative feedback loop that has a closed loop gain and a forward path gain; and
    means for opening the negative feedback loop, wherein the means for opening prevents quick changes in the closed loop gain, thereby reducing splatter, wherein the means for opening comprises a secondary feedback loop.

8. The apparatus of claim 7, wherein the secondary feedback loop is closing while the negative feedback loop is opening, and the secondary feedback loop is closed while the negative feedback loop is open.

9. The apparatus of claim 7, wherein the linear amplifier further comprises subsequent stages, and wherein the secondary feedback loop stabilizes operation of the subsequent stages in the linear amplifier when the linear amplifier is operating in an open loop condition.

10. The apparatus of claim 7, wherein the secondary feedback loop has a secondary path gain, and wherein as the forward path gain decreases, the secondary path gain increases.

11. An apparatus comprising:
    a linear amplifier having a negative feedback loop that has a closed loop gain and a forward path gain; and
    means for opening the negative feedback loop, wherein the means for opening prevents quick changes in the closed loop gain, thereby reducing splatter, wherein the means for opening prevents quick changes in the closed loop gain by adjusting the forward path gain according to $$GA_2K_2\exp[-A_1(t-t_d)/C],$$

where
    G is a constant;
    $A_2$ is a first transconductance gain;
    $K_2$ is a voltage at time $t_d$;
    $A_1$ is a second transconductance gain;
    t represents time;
    $t_d$ represents a time when the negative feedback loop is opened;
    C is capacitance.

12. An apparatus comprising:
    a linear amplifier having a negative feedback loop that has a closed loop gain and a forward path gain; and
    means for opening the negative feedback loop, wherein the means for opening prevents quick changes in the closed loop gain, thereby reducing splatter, wherein the means for opening prevents quick changes in the closed-loop gain by detecting splatter and allowing the forward path gain to decrease at as fast a rate possible while maintaining a reduced level of detected splatter.

13. A communication unit comprising:
    a transmitter, comprising:
        a linear amplifier having a negative feedback loop that has a closed loop gain and a forward path gain;

means for opening and closing the negative feedback loop, wherein the means for opening and closing prevents quick changes in the closed loop gain, thereby reducing splatter, wherein the means for opening and closing comprises a secondary feedback loop.

14. The apparatus of claim 13, wherein the secondary feedback loop is opening while the negative feedback loop is closing, and the secondary feedback loop is open while the negative feedback loop is closed and the secondary feedback loop is closing while the negative feedback loop is opening, and the secondary feedback loop is closed while the negative feedback loop is open.

15. The apparatus of claim 13, wherein the linear amplifier further comprises subsequent stages, and wherein the secondary feedback loop stabilizes operation of the subsequent stages in the linear amplifier when the linear amplifier is operating in an open loop condition.

16. The apparatus of claim 13, wherein the secondary feedback loop has a secondary path gain, and wherein as the forward path gain increases, the secondary path gain decreases, and wherein as the forward path gain decreases, the secondary path gain increases.

17. A communication unit comprising;
a transmitter, comprising:
a linear amplifier having a negative feedback loop that has a closed loop gain and a forward path gain;
means for opening and closing the negative feedback loop, wherein the means for opening and closing prevents quick changes in the closed loop gain, thereby reducing splatter, wherein the means for opening and closing prevents quick changes in the closed loop gain by adjusting the forward path gain according to $$GA_2K_1(\exp[A_1t/C]-1),$$

where
G is a constant;
$A_2$ is a first transconductance gain;
$K_1$ is current/$A_1$;
$A_1$ is a second transconductance gain;
t represents time;
C is capacitance.

18. A communication unit comprising:
a transmitter, comprising:
a linear amplifier having a negative feedback loop that has a closed loop gain and a forward path gain;
means for opening and closing the negative feedback loop, wherein the means for opening and closing prevents quick changes in the closed loop gain, thereby reducing splatter, wherein the means for opening and closing prevents quick changes in the closed-loop gain by detecting splatter and allowing the forward path gain to increase at as fast a rate possible while maintaining a reduced level of detected splatter.

19. A communication unit comprising:
a transmitter, comprising:
a linear amplifier having a negative feedback loop that has a closed loop gain and a forward path gain;
means for opening and closing the negative feedback loop, wherein the means for opening and closing prevents quick changes in the closed loop gain, thereby reducing splatter, wherein the means for opening and closing prevents quick changes in the closed loop gain by adjusting the forward path gain according to $$GA_2K_2\exp[-A_1(t-t_d)/C],$$

where
G is a constant;
$A_2$ is a first transconductance gain;
$K_2$ is a voltage at time $t_d$;
$A_1$ is a second transconductance gain;
t represents time;
$t_d$ represents a time when the negative feedback loop is opened;
C is capacitance.

20. A communication unit comprising:
a transmitter, comprising:
a linear amplifier having a negative feedback loop that has a closed loop gain and a forward path gain;
means for opening and closing the negative feedback loop, wherein the means for opening and closing prevents quick changes in the closed loop gain, thereby reducing splatter, wherein the means for opening and closing prevents quick changes in the closed-loop gain by detecting splatter and allowing the forward path gain to decrease at as fast a rate possible while maintaining a reduced level of detected splatter.

21. An apparatus comprising:
a linear amplifier having a negative feedback loop that has a closed loop gain and a forward path gain; and
means for closing the negative feedback loop, wherein the means for closing prevents quick changes in the closed loop gain, thereby reducing splatter, and wherein the means for closing prevents quick changes in the closed loop gain by adjusting the forward path gain as a positive exponential equation as time increases.

22. An apparatus comprising:
a linear amplifier having a negative feedback loop that has a closed loop gain and a forward path gain; and
means for opening the negative feedback loop, wherein the means for opening prevents quick changes in the closed loop gain, thereby reducing splatter, and wherein the means for opening prevents quick changes in the closed loop gain by adjusting the forward path gain as a negative exponential equation as time increases.

23. An apparatus comprising:
a first amplifier having a signal input, a control input, and an output;
a second amplifier having a positive input, a negative input, and an output, wherein the positive input of the second amplifier is coupled to the output of the first amplifier; and
a gain ramp having an input coupled to the output of the second amplifier, having a first output coupled to the negative input of the second amplifier, and having a second output coupled to the control input of the first amplifier.

24. The apparatus of claim 23, wherein a feedback loop is provided between the output of the second amplifier and the negative input of the second amplifier, and wherein the gain ramp further comprises an upramp for closing the feedback loop, wherein the upramp prevents quick changes in the closed loop gain, thereby reducing splatter.

25. The apparatus of claim 23, wherein a feedback loop is provided between the output of the second amplifier and the negative input of the second amplifier, and wherein the gain ramp further comprises a downramp for opening the feedback loop, wherein the downramp prevents quick changes in the closed loop gain, thereby reducing splatter.

26. An apparatus comprising:

a first amplifier having a signal input, a control input, and an output;

a second amplifier having a positive input, a negative input, and an output, wherein the positive input of the second amplifier is coupled to the output of the first amplifier; and a gain ramp having an input coupled to the output of the second amplifier, having a first output coupled to the negative input of the second amplifier, and having a second output coupled to the control input of the first amplifier, wherein the gain ramp comprises:

a feedback amplifier having an input, which is the input of the gain ramp, having an output, which is the first output of the gain ramp, having a first control input, which is coupled to ground potential, and having a second control input;

a fourth amplifier having a first output, which is the second output of the gain ramp, having a second output, which is coupled to ground potential, and having a positive input and a negative input;

a capacitor having a first end coupled to the positive input of the fourth amplifier and the second control input of the feedback amplifier; and having a second end coupled to the negative input of the fourth amplifier and ground potential;

a fifth amplifier having a positive input, which is coupled to the first end of the capacitor; having a negative input, which is coupled to ground potential; and having a first output and a second output;

a constant current source, having an output coupled to the second output of the fifth amplifier and having an input coupled to the first output input of the fifth amplifier; and a switch, coupled to the first end of the capacitor, ground potential, the input of the constant current source, and the output of the constant current source, such that when the switch is in a first position, the output of the constant current source is coupled to the second control input of the feedback amplifier and the input of the constant current source is coupled to ground potential; and when the switch is in a second position, the output of the constant current source is coupled to ground potential and the input of the constant current source is coupled to the second control input of the feedback amplifier.

* * * * *

UNITED STATES PATENT AND TRADEMARK OFFICE
CERTIFICATE OF CORRECTION

PATENT NO. : 5,559,468
DATED : September 24, 1996
INVENTOR(S) : Paul H. Gailus, Ronald H. Chapman, Jeffrey B. Wilhite It is certified that error appears in the above-indentified patent and that said Letters Patent is hereby corrected as shown below:

Column 7, claim 17, line 24 "comprising;" should be --comprising:--.

Signed and Sealed this

Fourth Day of March, 1997

Attest:

BRUCE LEHMAN

Attesting Officer     Commissioner of Patents and Trademarks